United States Patent [19]

Jusuf et al.

[11] Patent Number: 5,869,988
[45] Date of Patent: Feb. 9, 1999

[54] HIGH SPEED WRITE DRIVER FOR INDUCTIVE HEADS

[75] Inventors: Gani Jusuf, San Carlos; Sehat Sutardja, Cupertino, both of Calif.

[73] Assignee: Marvell Technology Group, Ltd., Hamilton, Bermuda

[21] Appl. No.: 827,030

[22] Filed: Mar. 25, 1997

[51] Int. Cl.⁶ .................................................. H03K 3/00
[52] U.S. Cl. ........................... 327/110; 327/108; 360/46; 360/67
[58] Field of Search ................................. 327/110, 108, 327/109, 300, 304; 360/46, 67

[56] References Cited

U.S. PATENT DOCUMENTS

| | | | |
|---|---|---|---|
| 3,770,986 | 11/1973 | Drehle | 327/110 |
| 5,243,472 | 9/1993 | Molstad | 360/67 |
| 5,285,477 | 2/1994 | Leonowich | 327/110 |
| 5,644,258 | 7/1997 | Wu | 327/110 |
| 5,677,642 | 10/1997 | Rehm et al. | 327/110 |

OTHER PUBLICATIONS

Ngo, et al., A Low–Power 3V–5.5V Read/Write Preamplifier For Rigid–Disk Drives, IEEE Int'l Solid State Circuits Conference, Feb. 18, 1994, pp. 286–287, and 354, Paper FA17.6 IEEE Digest of Technical Papers, 0–7803–1844–7/94.

Swart, et al., An 8–Channel, Head Preamplifier for Combination Magnetoresistive Read Elements and Inductive Write Elements, IEEE Int'l Solid State Circuits Conference, Feb. 26, 1993, pp. 218–219, and 291, Paper FA 13.4, IEEE Digest of Technical Papers, 1–7803–0987/93.

*Primary Examiner*—Toan Tran
*Attorney, Agent, or Firm*—Dennis & Irene Fernandez LLP

[57] ABSTRACT

A write driver for an inductive head of a magnetic storage medium that induces a faster write current switch across an inductive head element of a magnetic storage medium comprising having a pair of switches, $S_1$ and $S_2$, coupled to a pair of current sources, $I_1$ and $I_2$, wherein first switch $S_1$ is coupled to first current source $I_1$ and controlled by a first current switch control signal CLK. Second switch $S_2$ is coupled to second current source $I_2$ and controlled by second current switch control signal /CLK. First switch $S_1$ is also controlled by first current control signal CLK to maximize rail to rail voltage swing. Similarly, second switch $S_2$ is also controlled by second current control signal /CLK. In an alternative embodiment, a current booster is coupled to each current source to boost the write current to offset the otherwise decrease to write current due to damping resistor $R_d$ and to increase the write current rate change during current switch transition of CLK. In another alternative embodiment, a programmable damping resistor is incorporated to increase $R_d$ in order to momentarily increase write current during current switch transition of CLK and /CLK. In yet another embodiment, both a current booster is coupled to each current source and a programmable damping resistor is incorporated to maximize current during CLK transitions.

15 Claims, 9 Drawing Sheets

HIGH SPEED WRITE DRIVER FOR INDUCTIVE HEADS

FIELD OF THE INVENTION

This invention relates to recording of data on a magnetic storage medium, and more particularly to the implementation of the write current driver for inductive film heads used in the disk drives and tape drives.

BACKGROUND OF THE INVENTION

Disk drive and tape drive technologies are well known areas of the storage medium technology. However, the storage medium technology has not experienced a demand for substantial performance improvement until the more recent market demand for computers to handle multimedia. With the onset of multimedia applications, there is now a substantial performance improvement needed of disk drive and tape drive technology to satisfy the memory intensive requirements of the various multimedia applications, and to also support the increased access bandwidth required by the faster processors being developed for multimedia processing.

The density of the stored memory in a typical disk depends on how close the data can be written into disk. For an inductive head writer, the write current rise and fall times directly affect the density of a magnetic storage medium. The faster the write current rise and fall time, the faster the change of the magnetic flux, and consequently more bits per inch can be stored in the media. The rate of change of current in an inductor is calculated as shown in the following standard equations:

$$V = L_h (di/dt) \tag{1}$$

$$di/dt = V/L_h \tag{2}$$

where

V=the voltage swing across the thin film head $L_h$=the head inductance di/dt=the rate of change of the write current As shown in the above equation (2) the write current rate (di/dt), across an inductive head is directly proportional to the voltage swing across the thin film head (V), and accordingly a fast write current rate (di/dt), can be achieved by increasing voltage swing V across the head inductance, or by lowering the head inductance ($L_h$).

There is, however, a fundamental limit as to how fast current can change in an inductive device due to an inherent capacitor in the inductive head ($C_h$), along with the head inductance ($L_h$). The total capacitance ($C_{tot}$) is a combination of head capacitor ($C_h$), the parasitic capacitors, as well as the write driver capacitor ($C_d$). The fastest write current rise and fall time is limited to the resonance frequency of the ($L_h$) and ($C_{tot}$), more specifically the resonance frequency is proportional to the $1/\text{sqrt}[(L_h)(C_{tot})]$. At resonance frequency, overshoot and undershoot ringing will typically occur. Too much ringing results in prolonging the settling time of the write current, and consequently affecting the performance of the write driver. To remove ringing, damping resistor ($R_d$), is typically placed across the inductor head. Unfortunately, the damping resistor operates to slow down the write current rise and fall time by reducing the amount of current through the head inductor ($L_h$), as shown by the following equation for calculating the write current through the inductive head:

$$I_w = I/[1 + R_{head}/R_d] \tag{3}$$

The lower the damping resistor, $R_d$, the smaller the effective write current. Consequently, there is therefore a need for write drivers that can provide rail to rail voltage swing very quickly even with a damping resistor attached. More specifically, there is a need for write drivers that have faster write current rise and fall times to provide greater storage density to meet the demand for higher density and faster disk drives.

SUMMARY OF THE INVENTION

The present invention describes a write driver for an inductive head of a magnetic storage medium that induces a faster write current switch across an inductive head element of a magnetic storage medium comprising having a pair of switches, $S_1$ and $S_2$, coupled to a pair of current sources, $I_1$ and $I_2$, wherein first switch $S_1$ is coupled to first current source $I_1$ and controlled by a first current switch control signal CLK. Second switch $S_2$ is coupled to second current source $I_2$ and controlled by second current switch control signal /CLK. First switch $S_1$ is also controlled by first current control signal CLK to maximize rail to rail voltage swing. Similarly, second switch $S_2$ is also controlled by second current control signal /CLK. In one embodiment, a current booster is coupled to each current source to boost the write current to offset the otherwise decrease to write current due to $R_d$ and to increase the write current rate change during current switch transition of CLK. In another alternative embodiment, a programmable damping resistor is incorporated to increase $R_d$ in order to momentarily remove $R_d$ and thus increase write current during current switch transition of CLK. In yet another embodiment, both current booster circuits and a programmable damping resistor are combined to increase the write current rate change during current switch transition of CLK.

DETAILED DESCRIPTION

Figure 1:
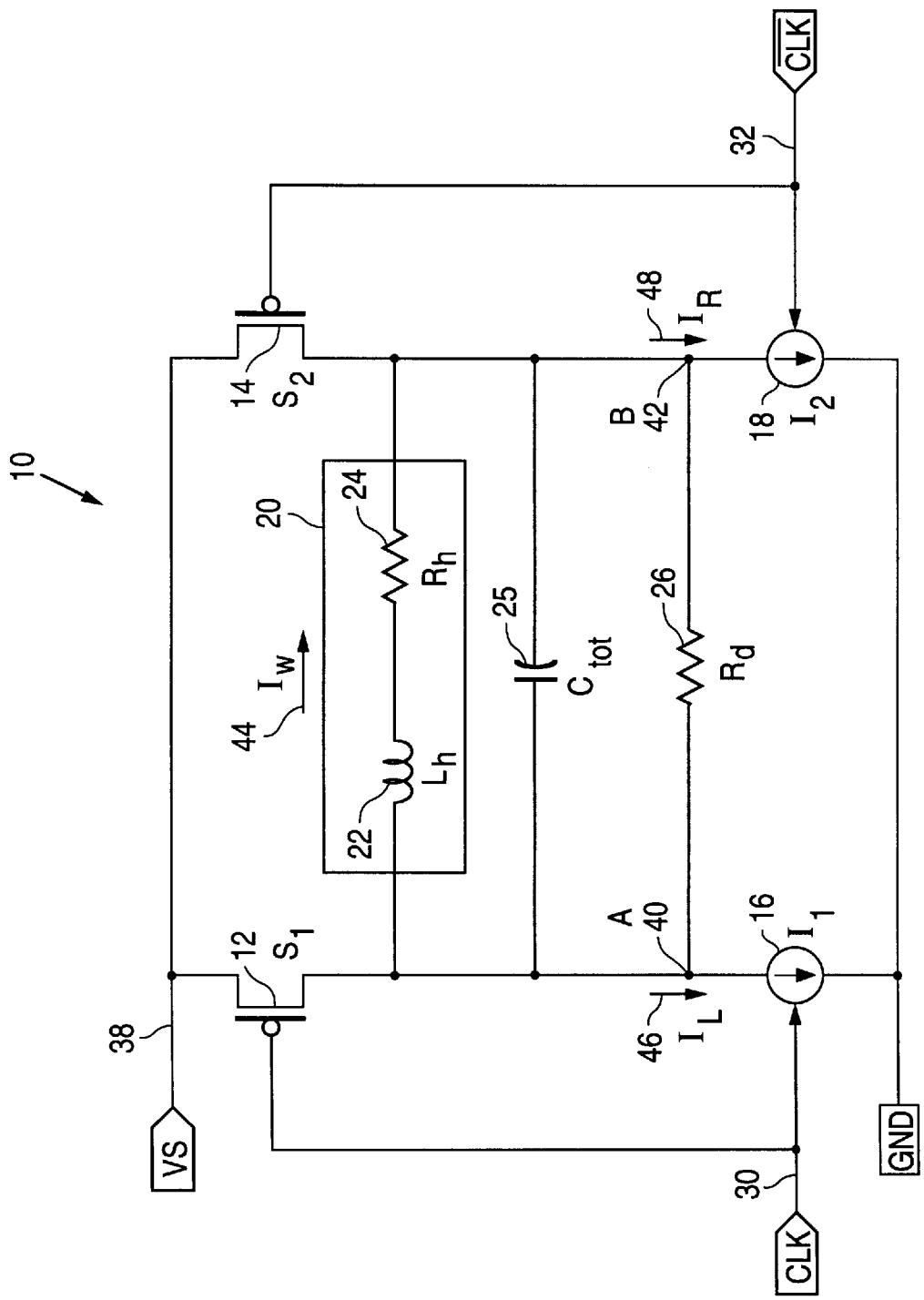
FIG. 1 illustrates a high speed write driver constructed in accordance with the principles of this invention.

FIG. 1 illustrates a high speed write driver 10 described in accordance with the principles of this invention. Write driver 10 induces a faster write current switch across an inductive head element 20 of a magnetic storage medium comprising having a pair of switches, including a first switch ($S_1$) 12 and a second switch ($S_2$) 14, coupled to a pair of current sources including a first current source ($I_1$) 16 and a second current source ($I_2$) 18. In the preferred embodiment switches $S_1$ and $S_2$ comprise PMOS transistors. However, it is envisioned that switches $S_1$ and $S_2$ can comprise NMOS type transistors and other types of transistors, such as JFET, Bi-CMOS, or other such transistor types having a low voltage drop. The pair of switches, $S_1$ and $S_2$, further comprise first switch $S_1$ 12 coupled between a maximum voltage source ($V_s$) 38, such as $V_{DD}$, and a first node (A) 40 of a damping resistor ($R_d$) 26. Node A 40 is also coupled to current source $I_1$ 16, and a first current switch control signal (CLK) 30 is coupled to control current source $I_1$ 16 and to switch $S_1$ 12 to generate a rail to rail voltage swing at node A 40 of damping resistor. Switch $S_2$ 14 is coupled between voltage source $V_{DD}$ 38 and to a second node (B) 42 of damping resistor $R_d$ 26. Node B 42 is also coupled to current source $I_2$ 18. A second current switch control signal (/CLK) 32 being a complementary signal of control signal CLK 30 is coupled to control current source $I_2$ 18 and to switch $S_2$ 14 to also produce a rail to rail voltage swing at node B 42 of damping resistor $R_d$ 26. It is envisioned that, in operation, write driver circuit 10 would be coupled to inductive head element 20, which typically comprises a head inductor element ($L_h$) 22 and a head inductor resistor ($R_h$) 24, with head element 20 coupled in parallel across node A 40 and node B 42 of damping resistor $R_d$ 26 so to quickly switch write current ($I_w$) 44 across head element 20. A capacitance ($C_{tot}$) 25 is shown to represent that capacitance exists due to inductive head element 20, its parasitic capacitance, and due to the capacitance of the write driver.

In operation, when CLK transitions from a voltage value corresponding to a digital logic high signal logic low signal (LOW) to a voltage value corresponding to a digital (HIGH), current source $I_1$ 16 switches ON to allow a current flow ($I_L$) 46, while switch $S_1$ 12 correspondingly switches OFF to disconnect from voltage source $V_{DD}$ 38. Also effective concurrently, switch $S_2$ 14 switches ON with /CLK signal 32 transitioning HIGH to LOW, thereby pulling node B 42 quickly to the voltage $V_{DD}$ value, while current source $I_2$ 18 shuts OFF turning off a current flow ($I_R$) 48 when /CLK signal 32 transitions LOW.

Figure 2:
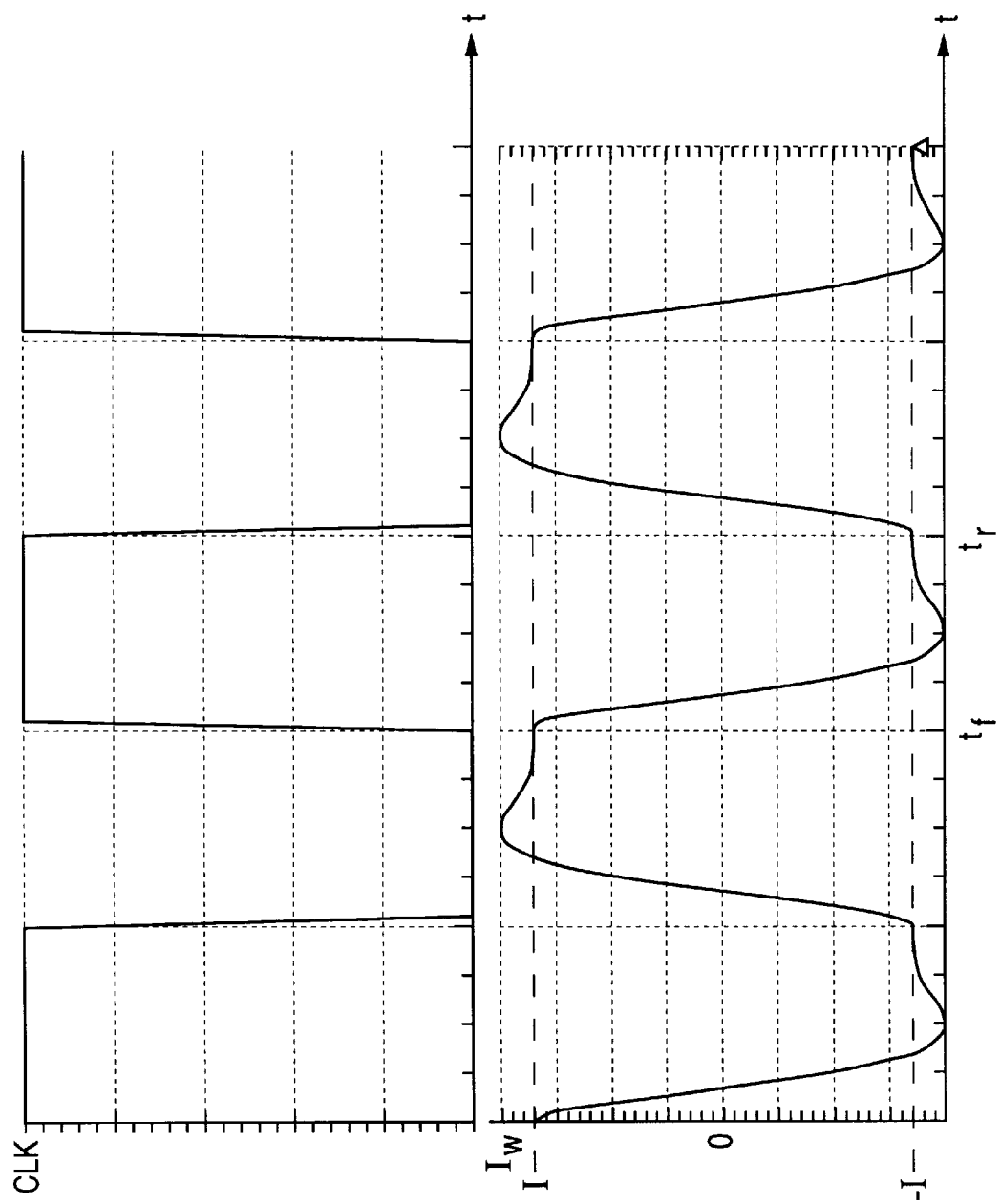
FIG. 2 illustrates a timing diagram for the high speed write driver of FIG. 1.

FIG. 2 illustrates a timing diagram for write driver 10 of FIG. 1. When CLK 30 transitions from LOW to HIGH, switch $S_1$ opens and $I_1$ turns ON, node A 40 is quickly pulled to a voltage value corresponding to a digital logic ground signal (GND) before settling to its final value, while node B 42 concurrently is quickly pulled up to a voltage source 38 (Vs) as switch $S_2$ closes and $I_2$ turns OFF. Accordingly, this results in a very fast rail to rail voltage swing at node A 40 and node B 42 during the clock transition, and thus correspondingly, generating a very fast write current fall time $t_f$ for write current $I_w$ 44 across damping resistor $R_d$ 26. Similarly, when CLK signal 30 transitions from a digital logic HIGH to a digital logic LOW voltage value, a very fast current rise time $t_r$ for write current $I_w$ 44 is produced when node A 40 is quickly pulled up to voltage source Vs 38 as switch $S_1$ 12 is closed, while node B is pulled to GND momentarily as switch $S_2$ 14 is opened. It is envisioned that in alternative embodiments, current sources $I_1$ and $I_2$ may be coupled to the most negative voltage source rather than GND.

Figure 3:
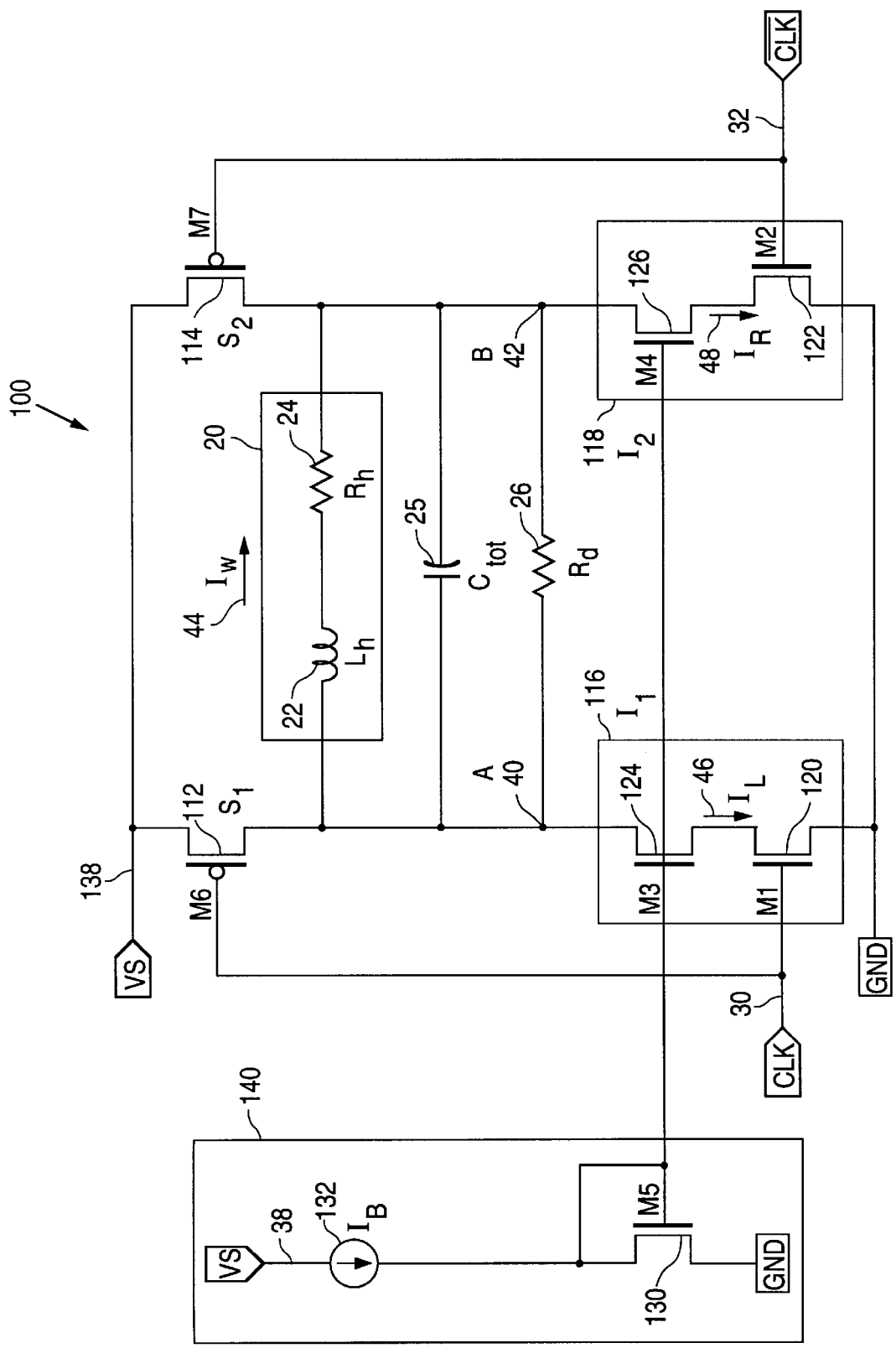
FIG. 3 illustrates an alternative embodiment of a high speed write driver shown in FIG. 1.

FIG. 3 illustrates an alternative embodiment of a high speed write driver described in accordance to the principles of this invention. In this embodiment, write driver 100 is illustrated in CMOS process technology. However, the concepts described in accordance with this invention is envisioned as applicable to other types of process technology, such as MOS, Gallium Arsenide, Bipolar, and other process technology for integrated circuits fabrication. The concepts described above for write driver 10 of FIG. 1 also applies for write driver 100 of FIG. 3. Write driver 100 comprises a pair of switches, a first switch ($S_1$) 112 and a second switch ($S_2$) 114 comprising PMOS transistors M6 and M7 respectively, coupled to a pair of current sources, comprising a first current source circuit ($I_1$) 116 that includes a first NMOS transistor ($M_1$) 120 coupled to a second NMOS transistor ($M_3$) 124 which is coupled to a typical current bias circuit 140, bias circuit 140 comprising a bias current source ($I_B$) 132 coupled to a self-biased NMOS transistor ($M_5$) 130. Similar to current source $I_1$ 116, a second current source circuit ($I_2$) 118 comprises a third NMOS transistor ($M_2$) 122 coupled to a fourth NMOS transistor ($M_4$) 126 which is also coupled to current bias circuit 140. The pair of switches further comprising switch $S_1$ 112 coupled between a voltage source ($V_s$) 38 and first node (A) 40 of damping resistor ($R_d$) 26. Node A 40 is also coupled to current source $I_1$ 116, and a first current switch control signal (CLK) 30 is coupled to control transistor M1 120 of current source $I_1$ 116 and to switch $S_1$ 112 to generate a rail to rail voltage swing at node A 40 of damping resistor 26. Switch $S_2$ 114 is coupled between the voltage source $V_s$ 38 and to a second node (B) 42 of damping resistor $R_d$ 26. Node B 42 of damping resistor $R_d$ 26 also being coupled to current source $I_2$ 118. A second current switch control signal (/CLK) 32, signal /CLK 32 being a complementary signal of control signal CLK 30, is coupled to control transistor $M_2$ 122 of current source $I_2$ 118 and to switch $S_2$ 114 to also produce a rail to rail voltage swing at node B 42 of damping resistor $R_d$ 26.

Accordingly, in similar operation to write driver 10 of FIG. 1 during a clock transition, such as when CLK 30 transitions from LOW to HIGH, current source $I_1$ 116 switches ON to allow current flow $I_L$ 46, while switch $S_1$ 112 correspondingly switches OFF to decouple from voltage source $V_s$ 38. Also effective concurrently, switch $S_2$ 114 switches ON when /CLK signal 32 transitions HIGH to LOW, thereby pulling node B 42 quickly to the voltage Vs value, while current source $I_2$ 118 shuts OFF blocking current flow $I_R$ 48. Consequently, $I_W$ 44 quickly switches the direction of its flow, such as to flow from node B to node A, rather than from node A to node B, thus corresponding to a fast write current rate change.

Figure 4:
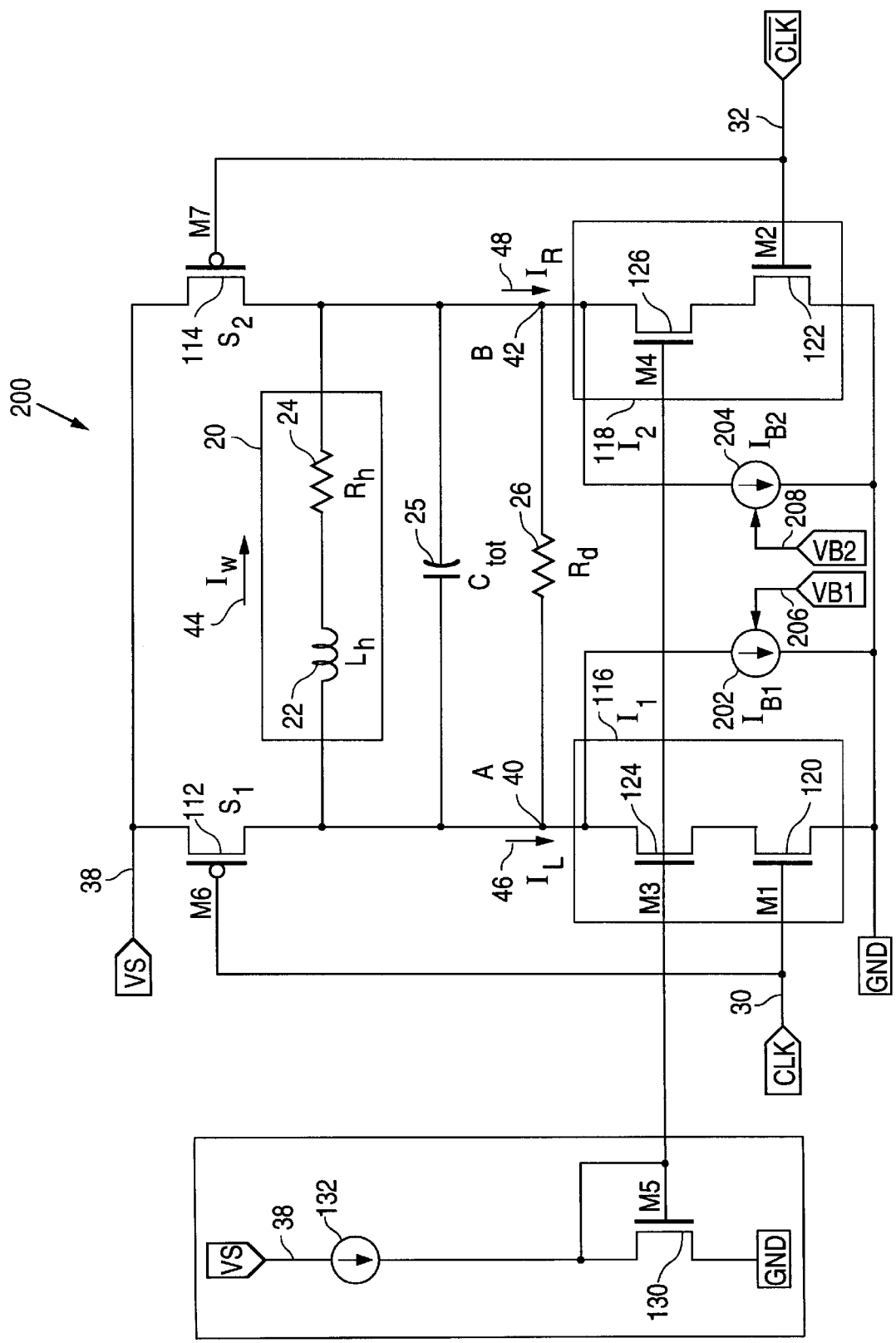
FIG. 4 illustrates another embodiment of write driver of FIG. 3 with current boosters.
Figure 5:
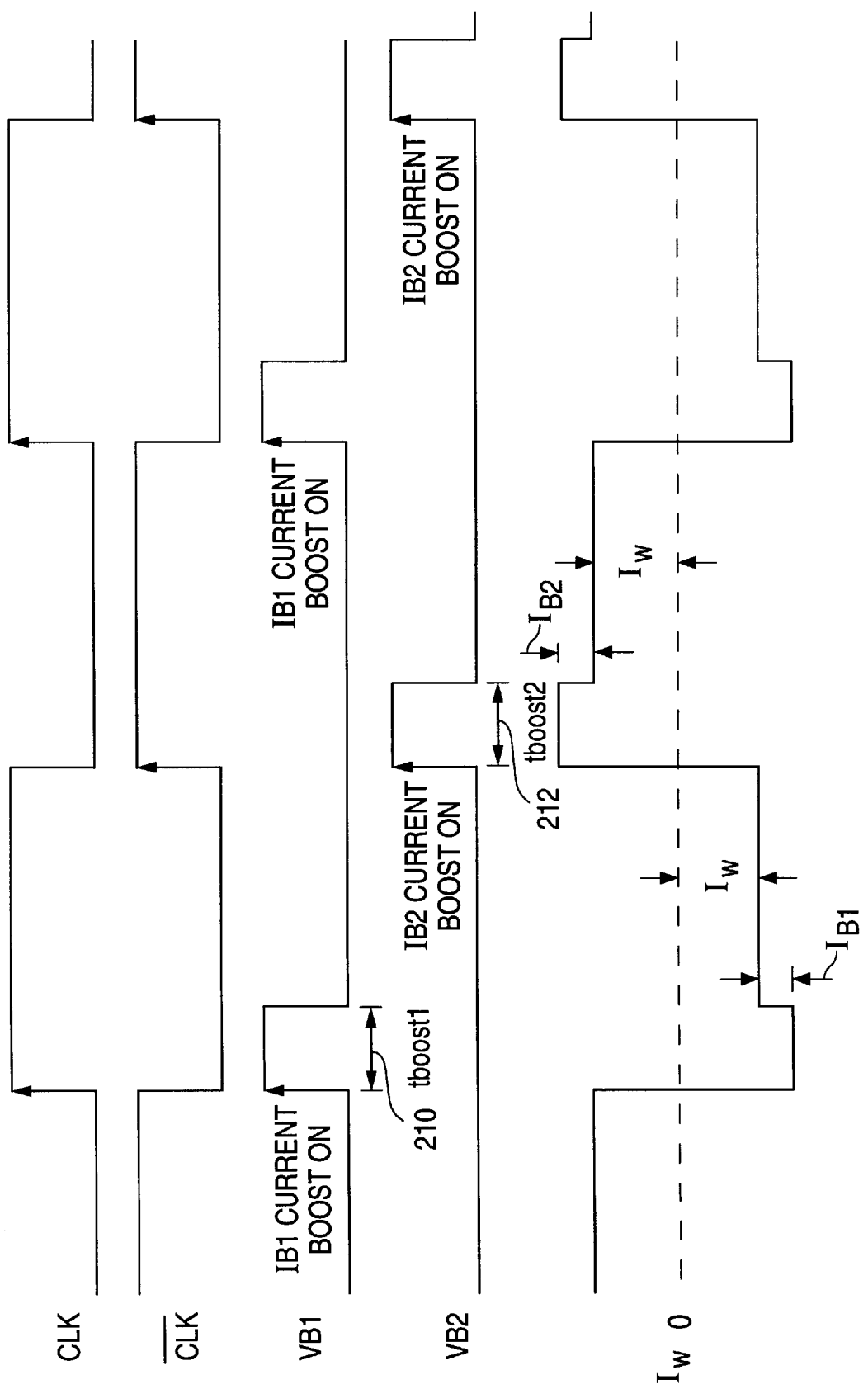
FIG. 5 illustrates a timing diagram for the high speed write driver of FIG. 4.

FIG. 4 illustrates another embodiment of a high speed write driver described in accordance with the principles of this invention. Write driver 200 operates essentially as described for write driver 100 of FIG. 3. However, write driver 200 further comprises a pair of additional current boosters including a first current booster ($I_{B1}$) 202 coupled to current source $I_1$ 116 and a second current booster ($I_{B2}$) 204 coupled to current source $I_2$ 118. As illustrated in the timing diagram of FIG. 5 (shown assuming $C_{tot}$=0), current booster $I_{B1}$ 202 is controlled by a first booster control signal ($V_{B1}$) 206 that is triggered by a rising edge of CLK signal so that current from $I_{B1}$ is added to current from current source $I_1$ to increase current $I_L$ 46 during CLK transition from LOW to HIGH. Since current $I_w$ 44 is proportional to $I_L$ 46 during CLK transition to HIGH, the increased current of $I_L$ 46 from current booster $I_{B1}$ thereby offsets any otherwise decrease of write current flowing through $R_d$ 26, and thus correspondingly generating a faster rise time of write current $I_w$ 44. Similarly, current booster $I_{B2}$ 204 is controlled by a second booster control signal ($V_{B2}$) 208 that is triggered by a rising edge of /CLK signal so that current from $I_{B2}$ is added to current from current source $I_2$ 118 to increase current $I_R$ 48 during /CLK transition from LOW to HIGH. Since current $I_w$ 44 is proportional to $I_R$ 48 during /CLK transition to HIGH, the increased current of $I_R$ 48 from current booster $I_{B2}$ thereby offsets any otherwise decrease of write current flowing through $R_d$ 26 during /CLK transition from LOW to HIGH. For symmetrical rise and fall times, $I_1$ should be equivalent to $I_2$ and $I_{B1}$ should be equivalent to $I_{B2}$, accordingly the current boost durations $t_{boost1}$ 210 and $t_{boost2}$ 212, are equivalent. It is envisioned that the amount of $I_{B1}$ and $I_{B2}$ and the boost current durations such as $t_{boost}$ 210 and 212 (FIG. 5) can be adjusted according to the desired $I_w$ as well as to correlate to the inductive head characteristic. Preferably, the current boost durations $t_{boost}$ 210 and 212 are set to a value such no significant undershoot occurs while speeding up the rise and fall times of $I_w$. Accordingly, with current boosters $I_{B1}$ 202 and $I_{B2}$ 204, write driver 200 provides a write current transition and thus a faster write operation.

Figure 6:
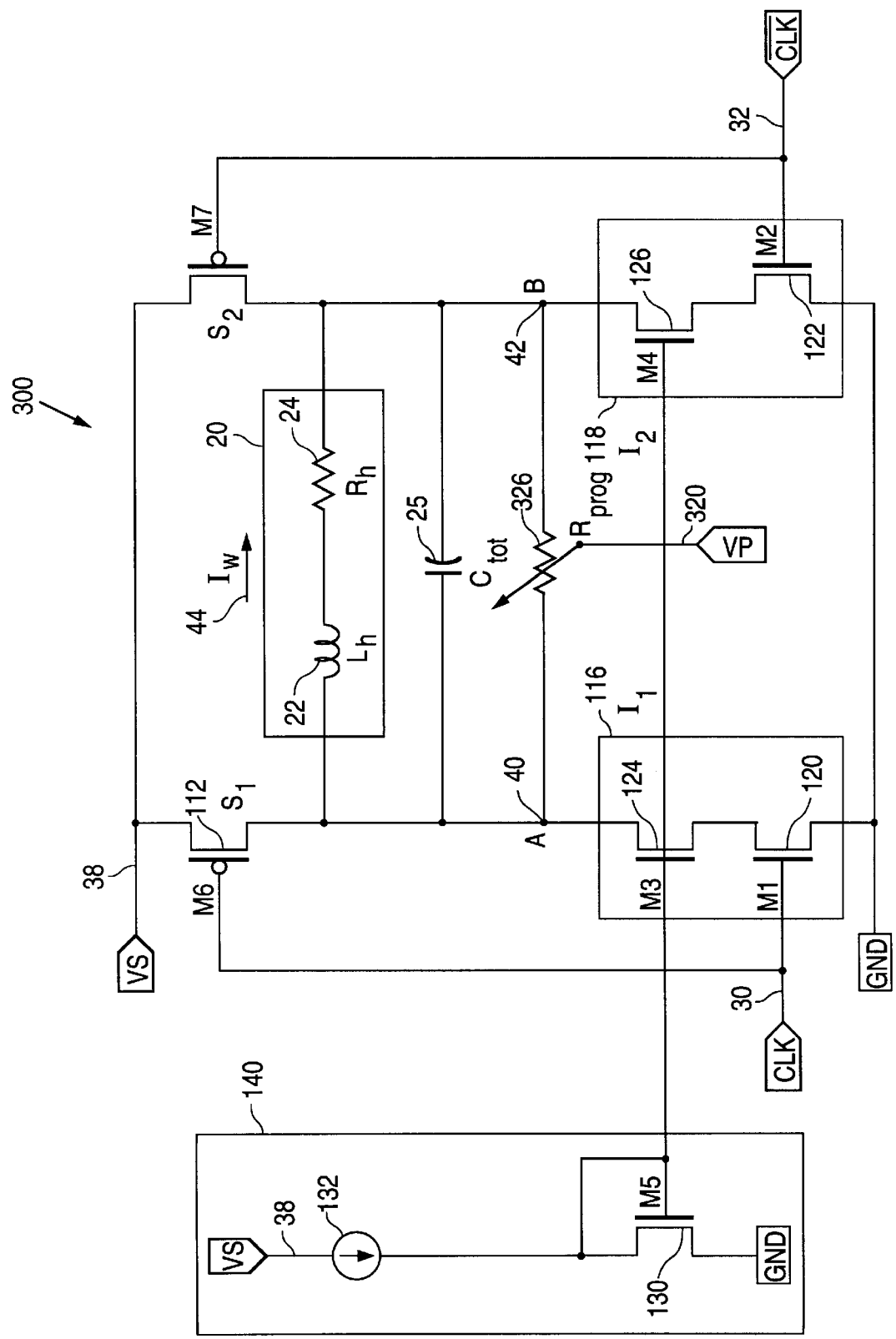
FIG. 6 illustrates another embodiment of write driver of FIG. 3 with a programmable damping resistor.
Figure 7:
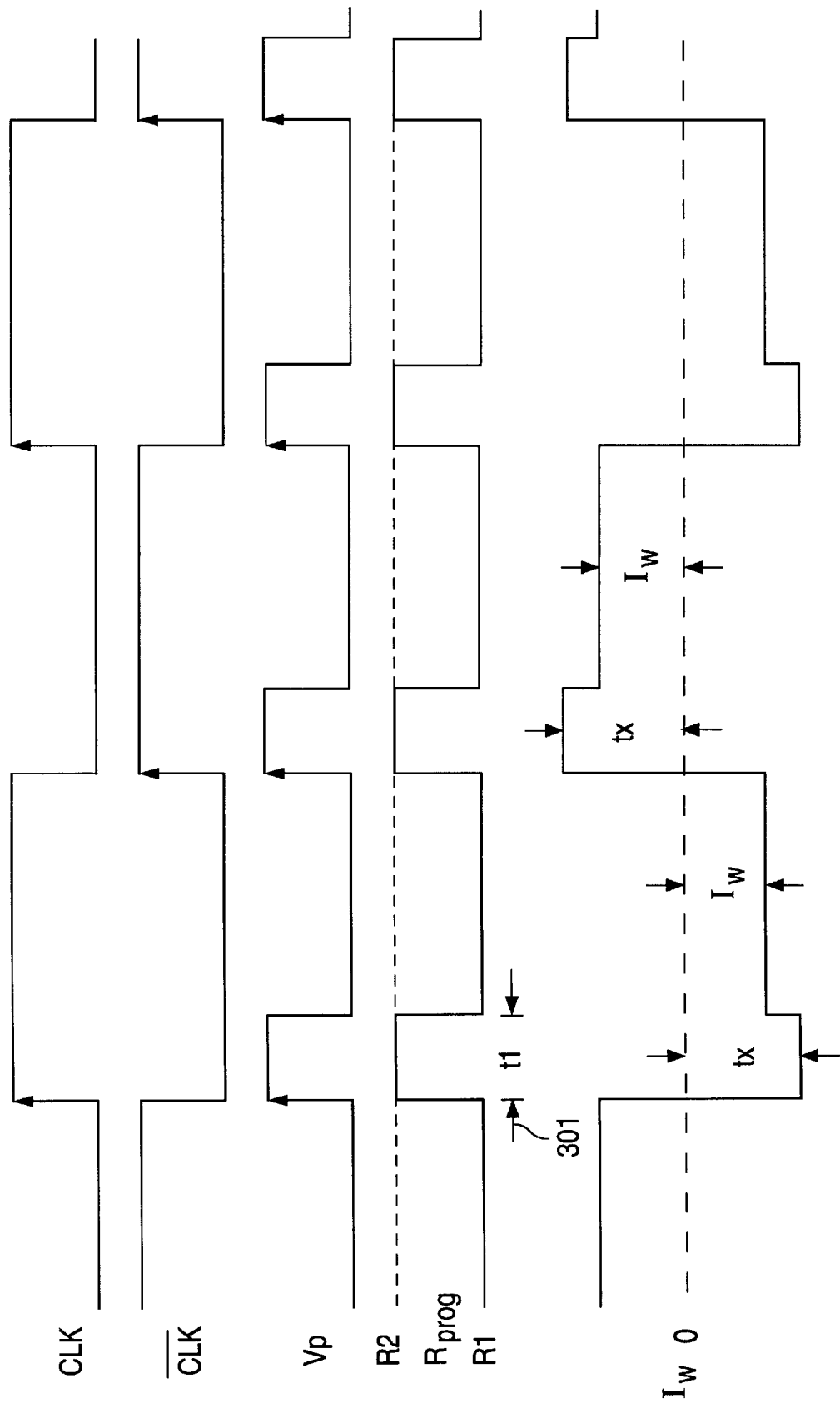
FIG. 7 illustrates a timing diagram for the high speed write driver of FIG. 6.

FIG. 6 illustrates yet another embodiment of write driver described in accordance with the principles of this invention. Write driver 300 also operates essentially as described for write driver 100 of FIG. 3. However write driver 300 has a programmable damping resistor $R_{prog}$ 326, rather than a fixed damping resistor 26 of write driver 100 and 200 of FIGS 3 and 4. Programmable resistor $R_{prog}$ 326 is controlled by a programmable timing signal $V_P$ 320 which is coupled to be triggered by a falling edge of either CLK 30 or /CLK 32. Timing signal $V_P$ 320 controls a range of value of $R_{prog}$ 326, such as from a desired value $R_1$ to a maximum value $R_2$, wherein $R_2 >> R_1$, e.g., $R_2$ approaches infinity and $R_{prog}$ 326 thus appearing effectively "disconnected" from node A 40 and node B 42. As illustrated in the timing diagram of FIG. 7 (shown assuming $C_{tot}$=0), at the beginning of a write operation, i.e., when CLK 30 transitions from LOW to HIGH, damping resistor $R_{prog}$ 326 can be programmed to a maximum value $R_2$ forcing $I_W$ 44 to be approximately equivalent to $I_L$ 46 for the duration of period $t_1$ 301 to thereby speed up the fall time of write current, $I_L$ 46 to generate a faster write operation. Similarly, when /CLK 32 transitions LOW to HIGH, damping resistor $R_{prog}$ 326 can be programmed to a maximum value R2 for a short time period $t_1$ 301 to thereby speed up the rise time of write current $I_w$ 44. Preferably, the programmable damping resistor $R_{PROG}$ 326 is programmed to a value for a finite duration such no significant undershoot occurs while improving write current rise and fall times. Accordingly, write driver 300 allows a faster write operation without increasing power consumption by having to increase current from the current sources.

Figure 8:
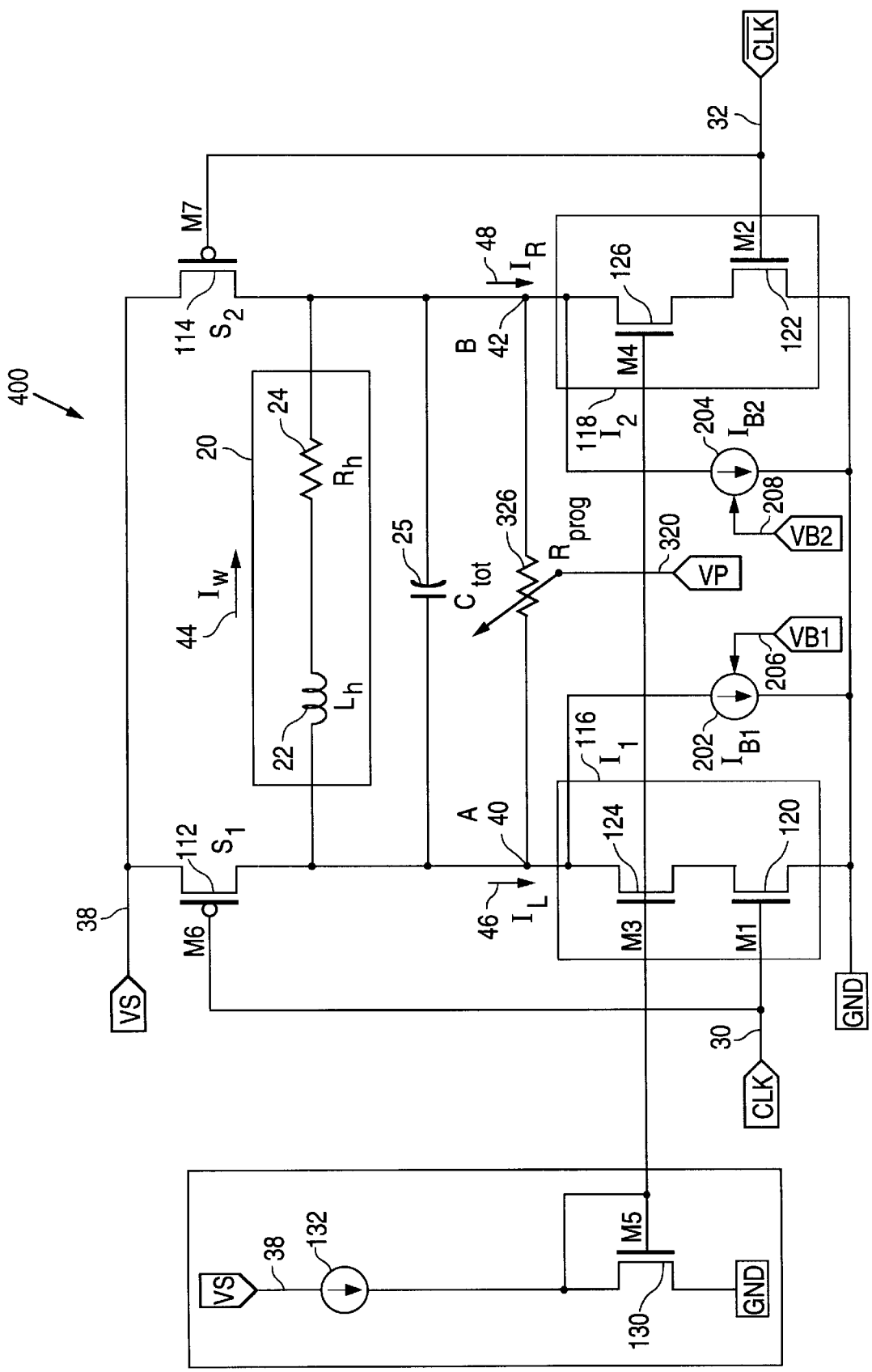
FIG. 8 illustrates yet another embodiment of write driver of FIG. 3 with both current boosters and programmable damping resistor.
Figure 9:
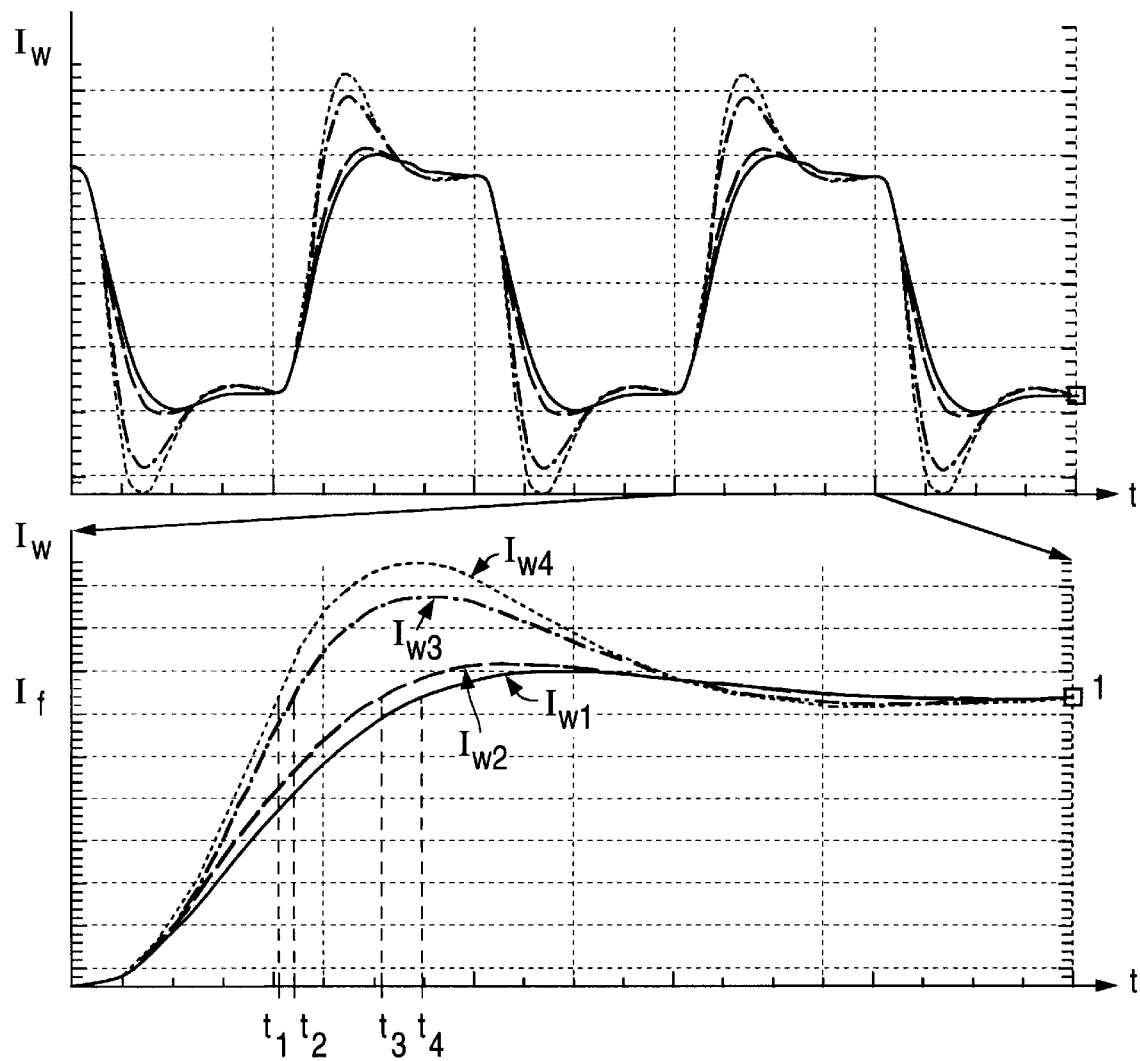
FIG. 9 illustrates a set of timing diagrams comparing the write current switch rates for write drivers of FIG. 1, FIG. 3, FIG. 4, FIG. 6, and FIG. 8.

FIG. 8 illustrates yet another embodiment of a write driver described in accordance with the principles of this invention. Write driver 400 operates essentially in principle as described for write drivers of FIGS. 3, 4 and 6. However, write driver 400 includes both current boosters described with FIG. 4 and programmable damping resistor $R_{prog}$ 326 of FIG. 6 to maximize write current $I_W$ 44, and thus consequently, maximizing the write current change rate during the clock transitions. As illustrated in the timing diagrams of FIG. 9 comparing the rise times of write current, e.g., when $I_w$ reaches a settled value, $I_p$ for the various embodiments described, the rise time $t_1$ for $I_{W4}$ write current rate for write driver 400 is the fastest compared to rise times $t_2$ corresponding to the rise time of write current $I_{W3}$ for write driver 300, $t_3$ the rise time of write current $I_{W2}$ for write driver 200, and $t_4$ the rise time for write current of write driver 100.

Several embodiments of a high speed write driver have been described herein in accordance with the principles of this invention. Although the preferred embodiment describes the pair of switches $S_1$ and $S_2$ as comprising PMOS type transistors, while current sources $I_1$ and $I_2$ comprise NMOS type transistors, it is further contemplated that the pair of switches can comprise NMOS type switches, while the pair of current sources comprise PMOS type transistors. In that embodiment the pair of current sources would be at the top of the write driver circuit, coupled respectively between preferably the most positive voltage source $V_s$ and the first node and second node of the damping resistor, $R_d$, while the pair of NMOS type switches would be coupled to the pair of current sources via the first and second nodes, respectively, of the damping resistor $R_d$, and preferably the most negative voltage source $-V_s$, or GND. Other variations and embodiments can be constructed without departing from the concepts taught by this invention.

We claim:

1. A high speed write driver for an inductive head element comprising:

a pair of switches, including a first switch ($S_1$) and a second switch ($S_2$), coupled to a pair of current sources including a first current source ($I_1$) and a second current source ($I_2$), wherein the first switch and the second switch comprise a first type of transistor and the first current source and the second current source comprise a second type of transistor, wherein the second type of transistor is a complementary transistor to the first type of transistor, the pair of switches further comprising:

the first switch $S_1$ coupled between a voltage source ($V_s$) and a first node of a damping resistor, the first node of the damping resistor also being coupled to a first node of the inductive head element and to the first current source $I_1$, a first current switch control signal (CLK) is coupled to control current source $I_1$ and to switch $S_1$ to generate a rail to rail voltage swing at the first node of damping resistor;

the second switch $S_2$ coupled between the voltage source $V_s$ and to a second node of the damping resistor, the second node of the damping resistor also being coupled to a second node of the inductive head element and to the second current source $I_2$, a second current switch control signal (/CLK), /CLK signal being a complementary signal of first control signal CLK, is coupled to control current source $I_2$ and to switch $S_2$ to produce a rail to rail voltage swing at the second node of the damping resistor; and a first current booster coupled to the first current source and a second current booster coupled to the second current source.

2. A high speed write driver for an inductive head element comprising:

a pair of switches, including a first switch ($S_1$) and a second switch ($S_2$), coupled to a pair of current sources including a first current source ($I_1$) and a second current source ($I_2$), wherein the first switch and the second switch comprise a first type of transistor and the first current source and the second current source comprise a second type of transistor, wherein the second type of transistor is a complementary transistor to the first type of transistor, the pair of switches further comprising:

the first switch $S_1$ coupled between a voltage source $V_s$) and a first node of a damping resistor, the first node of the damping resistor also being coupled to a first node of the inductive head element and to the first current source $I_1$, a first current switch control signal (CLK) is coupled to control current source $I_1$ and to switch $S_1$ to generate a rail to rail voltage swing at the first node of damping resistor;

the second switch $S_2$ coupled between the voltage source $V_s$ and to a second node of the damping resistor, the second node of the damping resistor also being coupled to a second node of the inductive head element and to the second current source $I_2$, a second current switch control signal (/CLK), /CLK signal being a complementary signal of first control signal CLK, is coupled to control current source $I_2$ and to switch $S_2$ to produce a rail to rail voltage swing at the second node of the damping resistor; and a first current booster coupled to the first current source and a second current booster coupled to the second current source and wherein the damping resistor is a programmable resistor.

3. A high speed write driver for an inductive head element comprising:

a pair of switches, including a first switch ($S_1$) and a second switch ($S_2$), coupled to a pair of current sources including a first current source ($I_1$) and a second current source ($I_2$), wherein the first switch and the second switch comprise a first type of transistor and the first current source and the second current source comprise a second type of transistor, wherein the second type of transistor is a complementary transistor to the first type of transistor, the pair of switches further comprising:

the first switch $S_1$ coupled between a voltage source ($V_s$) and a first node of a damping resistor, the first node of the damping resistor also being coupled to a first node of the inductive head element and to the first current source $I_1$, a first current switch control signal (CLK) is coupled to control current source $I_1$ and to switch $S_1$ to generate a rail to rail voltage swing at the first node of damping resistor;

the second switch $S_2$ coupled between the voltage source $V_s$ and to a second node of the damping resistor the second node of the damping resistor also being coupled to a second node of the inductive head element and to the second current source $I_2$, a second current switch control signal (/CLK), /CLK signal being a complementary signal of first control signal CLK, is coupled to control current source $I_2$ and to switch $S_2$ to produce a rail to rail voltage swing at the second node of the damping resistor;

wherein the first type of transistor is a PMOS transistor and the second type of transistor is an NMOS transistor; and a first current booster coupled to the first current source and a second current booster coupled to the second current source.

4. A high speed write driver for an inductive head element comprising:

a pair of switches, including a first switch ($S_1$) and a second switch ($S_2$), coupled to a pair of current sources including a first current source ($I_1$) and a second current source ($I_2$), wherein the first switch and the second switch comprise a first type of transistor and the first current source and the second current source comprise a second type of transistor, wherein the second type of transistor is a complementary transistor to the first type of transistor, the pair of switches further comprising:

the first switch $S_1$ coupled between a voltage source ($V_s$) and a first node of a damping resistor, the first node of the damping resistor also being coupled to a first node of the inductive head element and to the first current source $I_1$, a first current switch control signal (CLK) is coupled to control current source $I_1$ and to switch $S_1$ to generate a rail to rail voltage swing at the first node of damping resistor;

the second switch $S_2$ coupled between the voltage source $V_s$ and to a second node of the damping resistor, the second node of the damping resistor also being coupled to a second node of the inductive head element and to the second current source $I_2$, a second current switch control signal (/CLK), /CLK signal being a complementary signal of first control signal CLK, is coupled to control current source $I_2$ and to switch $S_2$ to produce a rail to rail voltage swing at the second node of the damping resistor; and a first current booster coupled to the first current source and a second current booster coupled to the second current source and wherein the damping resistor is a programmable resistor.

5. A high speed write driver for an inductive head element comprising:

a pair of current sources including a first current source ($I_1$) and a second current source ($I_2$), wherein the first current source comprises a first transistor and a second transistor coupled in series, the first transistor being coupled to a current bias circuit, and the second transistor coupled to ground; and wherein the second current source comprises a third transistor and a fourth transistor coupled in series, the third transistor being coupled to the current bias circuit, and the fourth transistor coupled to ground; and a pair of switches, including a first switch ($S_1$) and a second switch ($S_2$) coupled to the pair of current sources, wherein the first switch $S_1$ coupled between a voltage source ($V_s$) and a first node of a damping resistor, the first node of the damping resistor also being coupled to a first node of the inductive head element and to the first transistor of the first current source $I_1$, a first current switch control signal (CLK) is coupled to control the second transistor of the first current source $I_1$ and to switch $S_1$ to generate a rail to rail voltage swing at the first node of damping resistor;

wherein the second switch $S_2$ coupled between the voltage source $V_s$ and to a second node of the damping resistor, the second node of the damping resistor also being coupled to a second node of the inductive head element and to the third transistor of the second current source $I_2$, a second current switch control signal (/CLK), /CLK signal being a complementary signal of first control signal CLK, is coupled to control the fourth transistor of the current source $I_2$ and to switch $S_2$ to produce a rail to rail voltage swing at the second node of the damping resistor.

6. The high speed write driver of claim 5 further comprising a first current booster coupled to the first current source and a second current booster coupled to the second current source.

7. The high speed write driver of claim 5 wherein the damping resistor is a programmable resistor.

8. The high speed write driver of claim 5 wherein the pair of switches comprise PMOS transistors and the pair of current sources comprise NMOS transistors.

9. A high speed write driver for an inductive head element comprising:

a pair of current sources including a first current source ($I_1$) and a second current source ($I_2$), wherein the first current source comprises a first transistor and a second transistor coupled in series the first transistor being coupled to a current bias circuit, and the second transistor coupled to a negative voltage source ($-V_s$); and wherein the second current source comprises a third transistor and a fourth transistor coupled in series, the third transistor being coupled to the current bias circuit, and the fourth transistor coupled to the negative voltage source ($-V_s$); and a pair of switches including a first switch ($S_1$) and a second switch ($S_2$), coupled to the pair of current sources, wherein the first switch $S_1$ coupled between a positive voltage source ($V_s$) and a first node of a damping resistor, the first node of the damping resistor also being coupled to a first node of the inductive head element and to the first transistor of the first current source $I_1$, a first current switch control signal (CLK) is coupled to control the second transistor of the first current source $I_1$ and to switch $S_1$ to generate a rail to rail voltage swing at the first node of damping resistor;

wherein the second switch $S_2$ coupled between the positive voltage source $V_s$ and to a second node of the damping resistor, the second node of the damping resistor also being coupled to a second node of the inductive head element and to the third transistor of the second current source $I_2$, a second current switch control signal (/CLK), /CLK signal being a complementary signal of first control signal CLK, is coupled to control the fourth transistor of the current source $I_2$ and to switch $S_2$ to produce a rail to rail voltage swing at the second node of the damping resistor.

10. The high speed write driver of claim 9 further comprising a first current booster coupled to the first current source and a second current booster coupled to the second current source.

11. The high speed write driver of claim 9 wherein the damping resistor is a programmable resistor.

12. The high speed write driver of claim 9 wherein the pair of switches comprise PMOS transistors and the pair of current sources comprise NMOS transistors.

13. A high speed write driver for an inductive head element comprising:

a pair of current sources comprising PMOS type transistors, including a first current source ($I_1$) and a second current source ($I_2$), wherein the first current source comprises a first transistor and a second transistor coupled in series, the first transistor being coupled to a positive voltage source, and the second transistor coupled to a current bias circuit and wherein the second current source comprises a third transistor and a fourth transistor coupled in series, the third transistor being coupled to the positive voltage source, and the fourth transistor coupled to the current bias circuit; and a pair of switches comprising NMOS type transistors, including a first switch ($S_1$) and a second switch ($S_2$), coupled to the pair of current sources, wherein the first switch $S_1$ coupled between a negative voltage source and a first node of a damping resistor, the first node of the damping resistor also being coupled to a first node of the inductive head element and to the second transistor of the first current source $I_1$, a first current switch control signal (CLK) is coupled to control the first transistor of the first current source $I_1$ and to switch $S_1$ to generate a rail to rail voltage swing at the first node of damping resistor;

wherein the second switch $S_2$ coupled between the negative voltage source $V_s$ and to a second node of the damping resistor, the second node of the damping resistor also being coupled to a second node of the inductive head element and to the fourth transistor of the second current source $I_2$, a second current switch control signal (/CLK), /CLK signal being a complementary signal of first control signal CLK, is coupled to control the third transistor of the current source $I_2$ and to switch $S_2$ to produce a rail to rail voltage swing at the second node of the damping resistor.

14. The high speed write driver of claim 13 further comprising a first current booster coupled to the first current source and a second current booster coupled to the second current source.

15. The high speed write driver of claim 13 wherein the damping resistor is a programmable resistor.

* * * * *

UNITED STATES PATENT AND TRADEMARK OFFICE
CERTIFICATE OF CORRECTION

PATENT NO. : 5,869,988
APPLICATION NO. : 08/827030
DATED : February 9, 1999
INVENTOR(S) : Gani Jusuf et al.

It is certified that error appears in the above-identified patent and that said Letters Patent is hereby corrected as shown below:

Column 3, Line 31   Delete "high signal logic" after "digital logic"
Column 3, Line 32   After "digital" insert --logic high signal--
Column 5, Line 25   Insert --rising and a--before "falling"

Signed and Sealed this

Seventeenth Day of July, 2007

JON W. DUDAS
*Director of the United States Patent and Trademark Office*